(12) United States Patent
Lee

(10) Patent No.: US 7,102,196 B2
(45) Date of Patent: Sep. 5, 2006

(54) MULTI-LAYERED PRINTED CIRCUIT BOARD FOR EFFICIENT ELECTROSTATIC DISCHARGE PROTECTION

(75) Inventor: Joun Hee Lee, Seoul (KR)

(73) Assignee: Pantech Co., Ltd., Seoul (KR)

( * ) Notice: Subject to any disclaimer, the term of this patent is extended or adjusted under 35 U.S.C. 154(b) by 174 days.

(21) Appl. No.: 10/933,670

(22) Filed: Sep. 3, 2004

(65) Prior Publication Data

US 2005/0051846 A1 Mar. 10, 2005

(30) Foreign Application Priority Data

Sep. 8, 2003 (KR) ...................... 10-2003-0062570

(51) Int. Cl.
*H01L 23/62* (2006.01)
(52) U.S. Cl. ........................ 257/355; 257/758; 257/173
(58) Field of Classification Search ................ 257/758, 257/355, 173, 174, 297, 328, 357
See application file for complete search history.

(56) References Cited

U.S. PATENT DOCUMENTS 6,888,248 B1 * 5/2005 Chen et al. ................. 257/758

FOREIGN PATENT DOCUMENTS

| JP | 06-326476 | 11/1994 |
|---|---|---|
| JP | 2001-144452 | 5/2001 |
| KR | 1992-0015976 | 8/1992 |
| KR | 1999-015669 | 3/1999 |
| KR | 100305844 B1 | 8/2001 |
| KR | 10-0341077 | 9/2002 |

* cited by examiner

*Primary Examiner*—Mai-Huong Tran
(74) *Attorney, Agent, or Firm*—Ohlandt, Greeley, Ruggiero & Perle, L.L.P.

(57) ABSTRACT

Disclosed is a multi-layered PCB of mobile communication terminals that may improve ESD protection of LCD through efficiently protecting LCD signal lines such as data lines and control lines from ESD.

According to the present invention, the efficient arrangement of GND regions around the LCD signal lines improve ESD features of sub-LCD and main-LCD and reduce defects by ESD, so that reliability of mobile communication terminals may be improved and the mobile communication terminals may stably operate against unexpected situation. Accordingly, it is possible to improve quality of mobile communication terminals and to reduce manufacturing cost due to efficient PCB arrangement.

3 Claims, 4 Drawing Sheets

(the Related Art)

(the Related Art)

MULTI-LAYERED PRINTED CIRCUIT BOARD FOR EFFICIENT ELECTROSTATIC DISCHARGE PROTECTION

CROSS-REFERENCE TO RELATED APPLICATIONS

The entire disclosure of Korean Patent Application No. 10-2003-0062570 filed on Sep. 8, 2003 including specification, claims, drawings and summary, is incorporated herein by reference in its entirety.

BACKGROUND OF THE INVENTION

1. Field of the invention

The present invention relates to a multi-layered printed circuit board (PCB) for efficient electrostatic discharge (ESD) protection, and more particularly to a multi-layered PCB of mobile communication terminals that may improve ESD protection of LCD through efficiently protecting LCD signal lines such as data lines and control lines from ESD.

2. Description of the Related Art

Recently, metallic decorations are widely used in mobile communication terminals, as design of mobile communication terminals has been emphasized. In mobile communication terminals market, dual folder type mobile communication terminals are mainly manufactured and sold.

However, the dual folder type mobile communication terminals have a problem in that sub-LCD and main-LCD are vulnerable to static electricity (i.e., ESD). The reason why the dual folder type mobile communication terminals are vulnerable to static electricity is because many data lines and control lines are connected with folder portion comparing with existing mobile communication terminals.

Then, a general layout of PCB in mobile communication terminals will be described with reference to FIG. 1 as follows.

FIG. 1 illustrates a general main board PCB in mobile communication terminals, especially, a layout of inner layers having LCD signal lines.

As illustrated in FIG. 1, the PCB is a multi-layered PCB having at least a third inner layer 11, a fourth inner layer 12 and a fifth inner layer 13. Data lines 14 and control lines 15 in connection with LCD are positioned on the third inner layer 11, the fourth inner layer 12 and the fifth inner layer 13.

At this time, the data lines and the control lines on the third inner layer 11 are not protected from ESD by GND region on a layer above the third inner layer 11. And, the data lines and the control lines on the fifth inner layer 13 are not protected from ESD by GND region on a layer below the fifth inner layer 13.

Thus, the data lines and the control lines on the third inner layer 11 and the fifth inner layer 13 are easily damaged by ESD.

In this connection, FIG. 2 illustrates voltages of LCD signal lines on inner layers at the time of applying ESD to the general main board PCB.

It can be known from FIG. 2 that voltages of the data lines on the inner layer are 2.8 volt at normal condition and the voltages are suddenly increased to 4 volt when ESD is applied to the inner layer. In other words, the voltages of the data lines on the inner layer are suddenly increased at degrees of 1.2 volt when ESD is applied.

The surge of 1.2 volt, illustrated in 'A' part of FIG. 2, is too big for the data lines on the inner layer to endure, so that data signals, transmitted through the data lines on the inner layer, are easily damaged.

As circuits in the mobile communication terminals are being complicated, it is necessary to arrange more data lines and control lines on PCB. Thus, more ESD protection elements for protecting the data lines and the control lines are needed, so that difficulties in designing and manufacturing PCB are increased.

Further, it becomes difficult to arrange lots of elements on PCB because data lines and control lines occupy wide area of the PCB, as the number of the data lines and control lines are increased. Further, it becomes difficult to maintain original design of mobile communication terminals and to design multi-layered PCBs.

BRIEF SUMMARY OF THE INVENTION

Accordingly, the present invention has been made to solve the above-mentioned problems occurring in the related art, and an object of the present invention is to provide a multi-layered PCB for efficient ESD protection that may improve ESD protection of sub-LCD and main-LCD through efficiently arranging ground (GND) regions when designing PCB.

Another object of the present invention is to provide mobile communication terminals with improvement of quality and reliability, stable operations against unexpected situation and reduction of manufacturing cost, by improving ESD features of sub-LCD and main-LCD by protecting LCD signal lines with GND regions.

In order to accomplish these objects, there is provided a multi-layered PCB for efficient ESD protection, comprising: a third inner layer for discharging ESD, the third inner layer being a ground (GND) plane; a fourth inner layer on which a lot of LCD signal lines are positioned, the fourth inner layer being a layer below the third inner layer; and a fifth inner layer for discharging ESD, the fifth inner layer being a GND plane below the fourth inner layer.

Preferably, the LCD signal lines are positioned on one part of the fourth inner layer and GND region is positioned on the other part of the fourth inner layer.

Preferably, the GND region on the fourth inner layer and the GND planes of the third inner layer and the fifth inner layer are connected by a lot of GND holes and protect the LCD signal lines from ESD in three dimensions.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

According to the present invention, LCD signal lines such as data lines and control lines are protected by arranging the LCD signal lines on one part of inner layer, arranging GND regions on the other part of the inner layer, making a layer above the inner layer as GND plane and making a layer below the inner layer as GND plane.

Hereinafter, a preferred embodiment of the present invention will be described with reference to the accompanying drawings.

Figure 1:
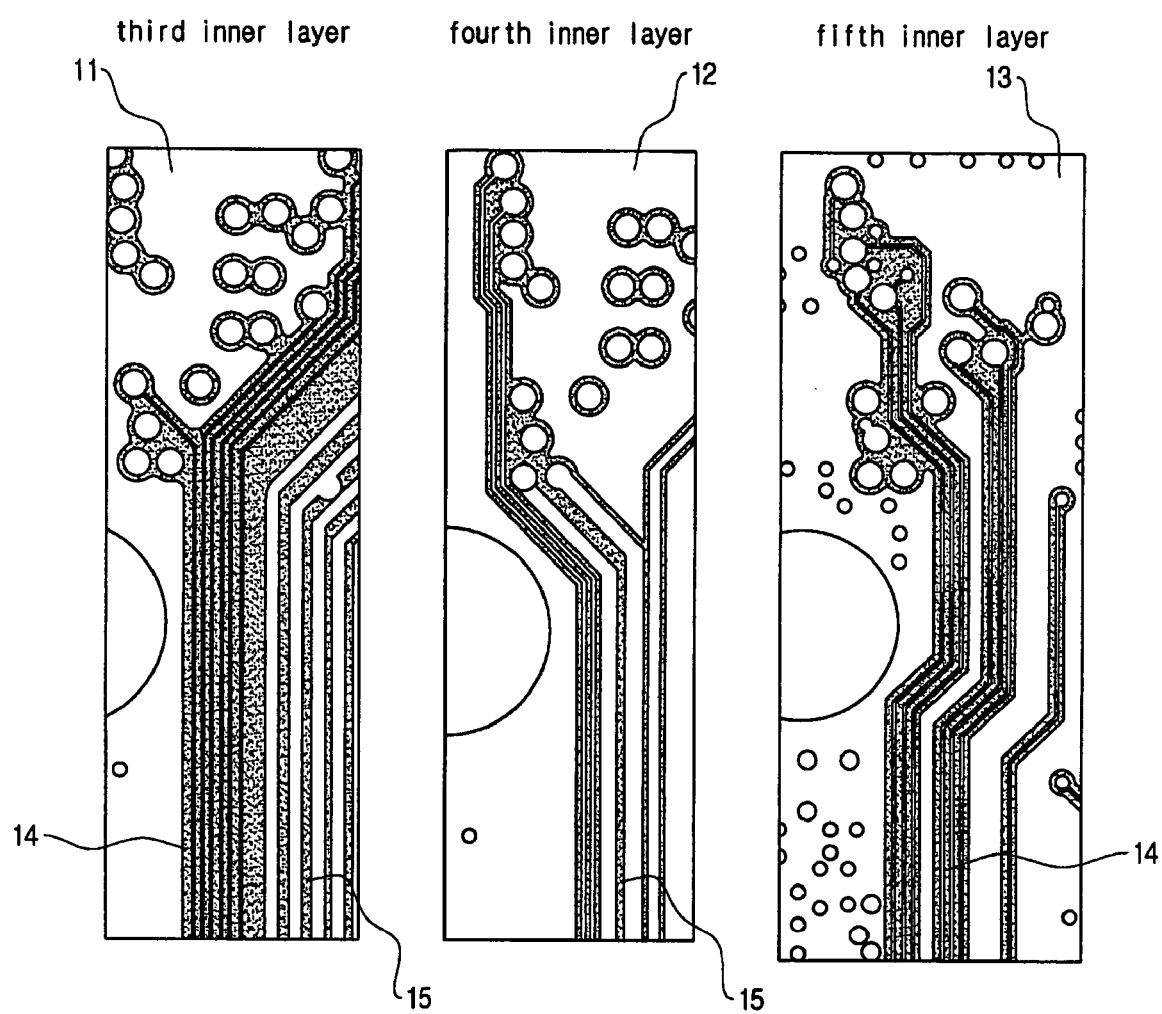
FIG. 1 illustrates a general main board PCB in mobile communication terminals, especially, a layout of inner layers having LCD signal lines.
Figure 2:
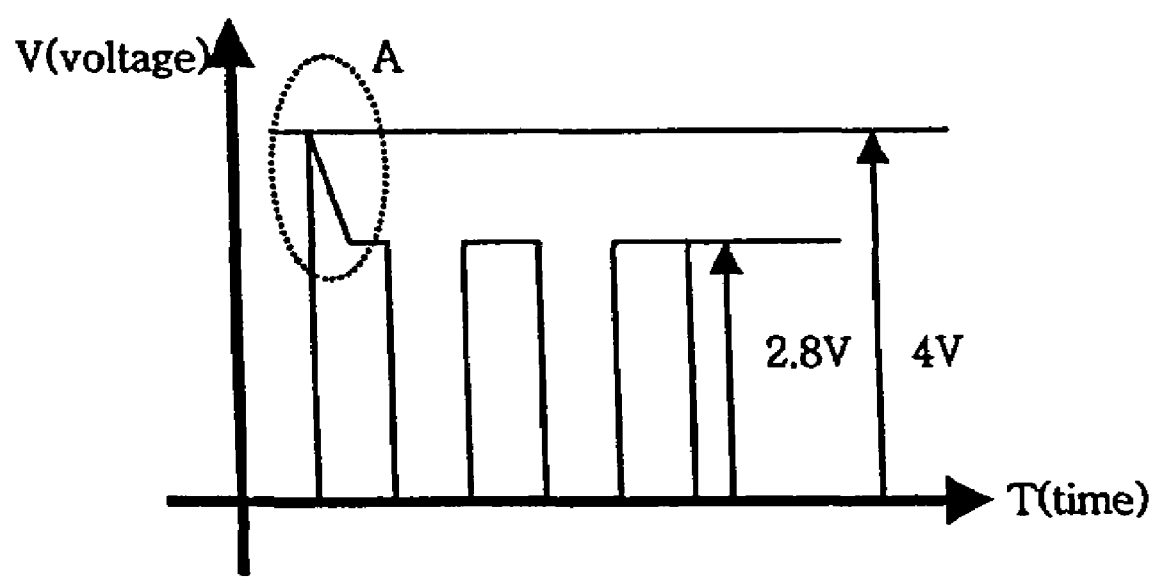
FIG. 2 illustrates voltages of LCD signal lines on inner layers illustrated in FIG. 1 at the time of applying ESD to the general main board PCB.
Figure 3:
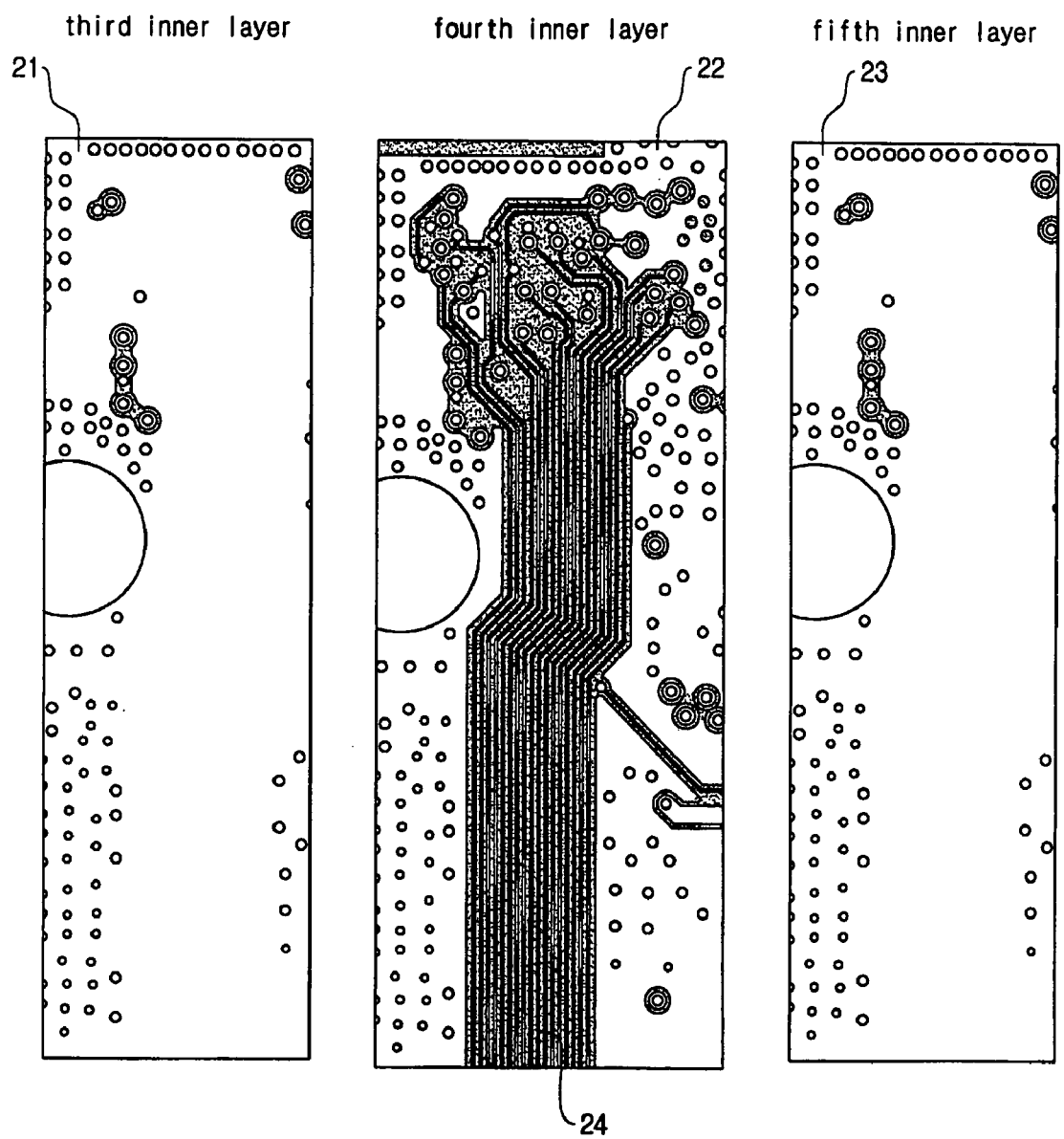
FIG. 3 illustrates a layout of inner layers according to a preferred embodiment of the present invention.

A multi-layered PCB for efficient ESD protection in mobile communication terminals according to an embodiment of the present invention has a lot of inner layers such as a third inner layer 21, a fourth inner layer 22 and a fifth inner layer 23, as illustrated in FIG. 3. At the time of designing the inner layers, LCD signal lines such as data lines and control lines are arranged on one part of the fourth inner layer 22, the other part of the fourth inner layer 22 is designed as GND region, and the third inner layer 21 and the fifth inner layer 23 are designed as GND planes. Further, the GND region on the fourth inner layer 22 and the GND planes of the third inner layer 21 and the fifth inner layer 23 are connected with each other by a lot of GND holes.

In other words, the LCD signal lines on the fourth inner layer 22 are protected from ESD in three dimensions by the GND region on the fourth inner layer 22 and the GND planes of the third inner layer 21 and the fifth inner layer 23.

Accordingly, the GND region on the fourth inner layer 22 and the GND planes of the third inner layer 21 and the fifth inner layer 23 play roles as barriers for the LCD signal lines against ESD (i.e., ESD is discharged into the GND region and the GND planes without influencing on LCD signal lines), thereby improving ESD features of sub-LCD and main-LCD in connection with the LCD signal lines.

In other words, the GND region on the fourth inner layer 22 and the GND planes of the third inner layer 21 and the fifth inner layer 23 significantly reduce intensity of ESD applied to surface of the multi-layered PCB, so that voltages of the LCD signal lines remain stable, thereby improving ESD features of sub-LCD and main-LCD.

Figure 4:
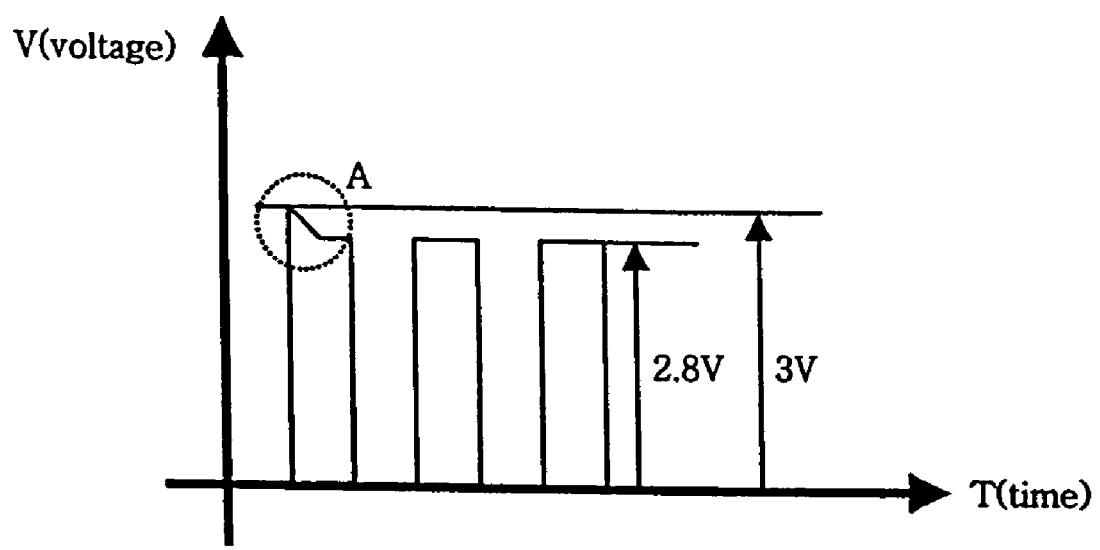
FIG. 4 illustrates voltages of LCD signal lines on inner layers illustrated in FIG. 3 at the time of applying ESD to the main board PCB according to the preferred embodiment of the present invention.

FIG. 4 illustrates voltages of the LCD signal lines such as data lines at the time of applying ESD. It may be known that fluctuations in the voltages of the data lines become reduced to a degree of 0.2 volt, comparing with the related art. In other words, variation of the voltages of the data lines is only 0.2 volt even when ESD is applied. Further, the variation of 0.2 volt, illustrated in 'A' part of FIG. 4, is within endurance of the data lines. Thus, data signals transmitted through the data lines on the inner layer can be protected well from ESD.

Accordingly, it is apparent from FIG. 4 that sub-LCD and main-LCD can be protected from ESD according to the preferred embodiment of the present invention.

As described above, the multi-layered PCB for efficient ESD protection in mobile communication terminals according to an embodiment of the present invention provides mobile communication terminals with stable operations and improved ESD features.

Particularly, the multi-layered PCB for efficient ESD protection in mobile communication terminals according to an embodiment of the present invention may prevent errors that mobile communication terminals vulnerable to ESD (e.g., dual folder type mobile communication terminals) are suddenly reset or go through temporary failure in operations when ESD is unexpectedly generated and applied to the mobile communication terminals in dry weather such as in winter.

Also, various defects which may occur in main-LCD and sub-LCD of the dual folder type mobile communication terminals, such as upside-down image, change of brightness of image and so on can be prevented by the present invention.

That is, to improve ESD features using the multi-layered PCB for efficient ESD protection according to the present invention makes it possible to perform stable operation against an unexpected situation, to improve quality and reliability of the mobile communication terminals, and to reduce manufacturing cost due to efficient PCB arrangement including reduction of the number of the ESD protection elements.

As can be seen from foregoing, the arrangement of GND region around the LCD signal lines and the reinforcement of GND regions improve ESD features of the sub-LCD and main-LCD and reduce defects by ESD, so that reliability of mobile communication terminals may be improved and the mobile communication terminals may stably operate against unexpected situation. Accordingly, it is possible to improve quality of mobile communication terminals and to reduce manufacturing cost due to efficient PCB arrangement.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A multi-layered printed circuit board (PCB) for efficient electrostatic discharge (ESD) protection, comprising:
   a third inner layer for discharging ESD, the third inner layer being a ground (GND) plane;
   a fourth inner layer on which a lot of LCD signal lines are positioned, the fourth inner layer being a layer below the third inner layer; and
   a fifth inner layer for discharging ESD, the fifth inner layer being a GND plane below the fourth inner layer.

2. The multi-layered PCB of claim 1, wherein the LCD signal lines are positioned on one part of the fourth inner layer and GND region is positioned on the other part of the fourth inner layer.

3. The multi-layered PCB of claim 2, wherein the GND region on the fourth inner layer and the GND planes of the third inner layer and the fifth inner layer are connected by a lot of GND holes and protect the LCD signal lines from ESD in three dimensions.

* * * * *